United States Patent [19]
Coghlan et al.

[11] Patent Number: 5,394,536
[45] Date of Patent: Feb. 28, 1995

[54] STABLE MEMORY CIRCUIT USING DUAL PORTED VRAM WITH SHIFT REGISTERS IN A MULTIPLE MEMORY BANK SETUP FOR HIGH SPEED DATA-TRANSFER

[75] Inventors: Brian A. Coghlan, Malahide; Jeremy O. Jones, Clontarf, both of Ireland

[73] Assignees: The Provost, Fellows and Scholars of Trinity College Dublin, Dublin; Brian A. Coghlan, Malahide; Jeremy O. Jones, Clontarf, all of Ireland; a part interest

[21] Appl. No.: 118,355

[22] Filed: Sep. 9, 1993

Related U.S. Application Data
[63] Continuation of Ser. No. 580,573, Sep. 11, 1990, abandoned.

[30] Foreign Application Priority Data
Sep. 11, 1989 [IE] Ireland .................................. 2223/89

[51] Int. Cl.6 ...................... G06F 12/06; G06F 12/16; G06F 13/00
[52] U.S. Cl. ............................. 395/425; 364/DIG. 1; 364/246.3; 364/964; 364/964.31; 364/965.79; 365/230.05; 365/230.03; 395/275
[58] Field of Search ................... 395/425, 400; 364/200 MS File, 900 MS File; 365/230.05, 230.03

[56] References Cited
U.S. PATENT DOCUMENTS

| | | | |
|---|---|---|---|
| 4,503,534 | 3/1985 | Budde et al. | 364/200 |
| 4,639,890 | 1/1987 | Heilveil et al. | 365/230.09 |
| 4,799,186 | 1/1989 | Ployette | 395/425 |
| 4,891,794 | 1/1990 | Hush et al. | 365/230.09 |
| 4,924,415 | 5/1990 | Winser | 364/200 |
| 5,005,011 | 4/1991 | Perlman et al. | 340/728 |
| 5,058,051 | 10/1991 | Brooks | 395/425 |
| 5,065,369 | 11/1991 | Toda | 365/230.05 |
| 5,084,836 | 1/1992 | Yamaguchi | 395/800 |
| 5,093,807 | 3/1992 | Hashimoto et al. | 365/230.09 |
| 5,093,910 | 3/1992 | Tulpule et al. | 371/68.1 |
| 5,121,360 | 6/1992 | West et al. | 365/230.09 |
| 5,142,637 | 8/1992 | Harlin et al. | 365/230.09 |
| 5,163,024 | 11/1992 | Heilveil et al. | 365/230.09 |

Primary Examiner—Joseph L. Dixon
Assistant Examiner—Frank J. Asta
Attorney, Agent, or Firm—Jacobson, Price, Holman & Stern

[57] ABSTRACT

A stable memory circuit which includes a pair of memory banks (2(a)) and (2(b)) each having eight arrays of eight VRAMs (3). Each VRAM (3) is dual-ported and includes a processor port connected to a processor bus (6) and a stable memory port connected to a stable memory bus (7). Accordingly, stable memory operations such as copying operations may be carried out on the stable memory bus (7) concurrently with conventional random accesses by a host processor via the processor port (6) and with very little use of processor time. Further, the stable memory ports of VRAMs (3) are serial ports and each memory bank (2(a)) and (2(b)) may transfer data at high speed using wide serial data path.

5 Claims, 4 Drawing Sheets ns/nns# STABLE MEMORY CIRCUIT USING DUAL PORTED VRAM WITH SHIFT REGISTERS IN A MULTIPLE MEMORY BANK SETUP FOR HIGH SPEED DATA-TRANSFER This is continuation of application Ser. No. 07/580,573, filed Sep. 11, 1990, which was abandoned upon the filing hereof.

BACKGROUND OF THE INVENTION

1. Field of the Invention

The invention relates to a stable memory circuit and to a computer incorporating such a circuit.

The term "stable memory" is intended to cover memory, the contents of which is not corrupted under fault conditions such as power failure or faulty processor operation and with which atomic stable memory operations may be performed.

2. Prior Art

Heretofore, stable storage has often been achieved by use of duplicated peripheral storage devices such as disks to which data is regularly copied. Verification operations are carried out to ensure that the copy operations have been correctly carried out to each of the peripheral storage devices in turn. The copy and verification sequence is called an atomic transaction since it is designed only to succeed or fail- no other result is allowed, and failure does not result in corruption of data. The major problem with this arrangement is that operation of a processor is significantly slowed down because transmission of data and instructions to the peripheral storage devices takes a significant amount of time.

In another approach such as that described in U.S. Pat. No. 4,799,186 (PLOYETTE) stable memory is provided by duplicated on-board memory circuits. This results in less time being required by the processor to perform the atomic transactions, both because memory circuits are generally much faster than peripheral storage circuits and because the sequence of operations may be carried out by a controller within the stable memory circuit itself. However, there is still a significant use of processor time because the stable memory circuit acts as a peripheral storage device that must have data copied to it from conventional memory, and it cannot act as conventional memory at any time, even when stable memory operation is not required.

OBJECTS OF THE INVENTION

It is an object of the invention to provide a stable memory circuit which allows stable memory operations to be carried out concurrently with host processor operations and with very little use of host processor time so that the stable memory operations are effectively "transparent" to the host processor. It is another object to provide a stable memory circuit that can be part of a main memory of a processor and can behave as conventional memory of increased capacity when stable memory operation is not required and can be dynamically partitioned between conventional and stable memory on a block-by-block basis.

Another object is to allow intelligent data processing operations to be carried out on data involved in a stable memory operation with little overhead requirement of the host processor.

A further object is to allow relatively fast execution of stable memory operations.

A still further object is to provide an inexpensive stable memory circuit.

SUMMARY OF THE INVENTION

According to the invention, there is provided a stable memory circuit comprising two or more memory banks, each comprising at least one memory device, wherein a memory device is of the dual-ported type having two separate ports, namely, a processor port for host processor random accesses and a separate, additional stable memory port connected to another memory bank by a stable memory bus for carrying out of stable memory operations under direction of a control means concurrently with random access communication with the host processor via the processor port.

The invention will be more clearly understood from the following description of some preferred embodiments thereof, given by way of example only with reference to the accompanying drawings.

DESCRIPTION OF THE PREFERRED EMBODIMENTS

Figure 1:
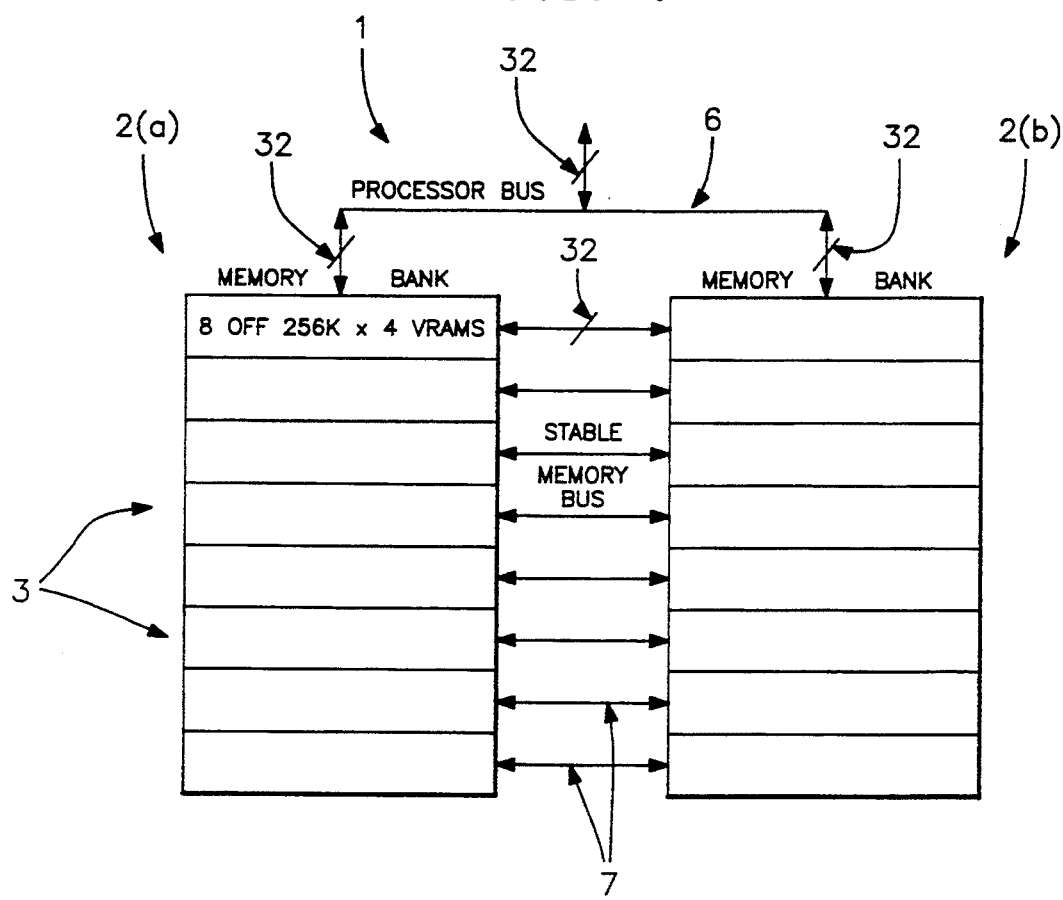
FIG. 1 is a schematic representation of a stable memory circuit of the invention.
Figure 2:
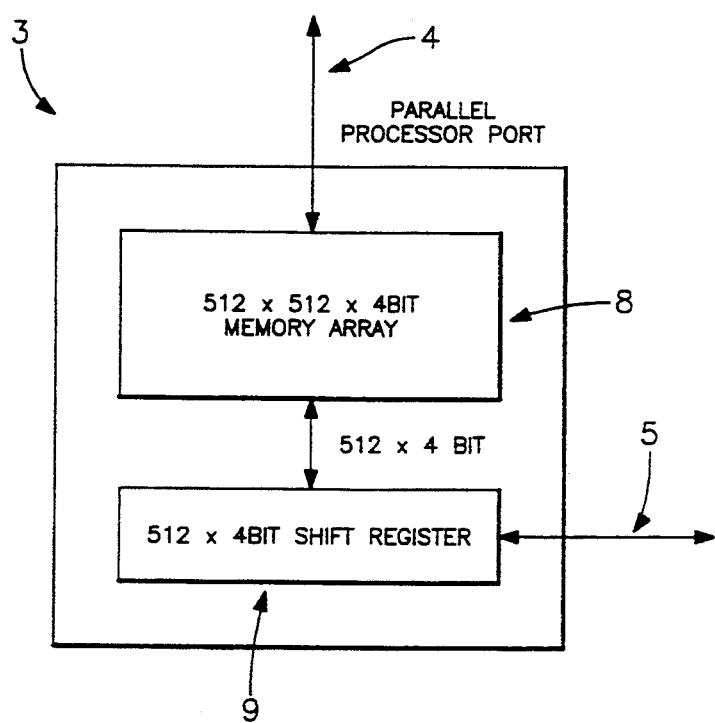
FIG. 2 is a detailed view of a memory device for use in the circuit.

Referring to the drawings, and initially to FIG. 1, there is illustrated a stable memory circuit of the invention indicated generally by the reference numeral 1. The circuit I comprises a pair of memory banks 2(a) and 2(b). Each memory bank 2(a) and 2(b) comprises eight arrays each having eight memory devices, namely, 256k×4 dual-ported video random access memories (VRAMs) 3. Referring to FIG. 2, each VRAM 3 includes a parallel processor port 4 which is 4 bits wide. Each VRAM 3 also includes a separate, additional serial stable memory port 5. In this specification, the term "serial port" is intended to cover ports which may in fact be, strictly speaking, parallel ports, but which are generally referred to as serial ports. Referring again to FIG. 1, the processor ports 4 are connected to a processor bus 6 which is 32 bits wide, for connection with a host processor. The stable memory ports 5 are connected to a stable memory bus 7. There is a stable memory bus 7 for each array of eight VRAMs 3. Each stable memory bus 7 connects VRAMs 3 in each bank directly to associated VRAMs 3 in the other bank. It will be appreciated, however, that there may be any number and possibly only one stable memory bus common to all arrays of VRAMs 3.

In this specification, the term "processor bus" is intended to cover a bus which connects a stable memory circuit with any external processor or control circuit. It may also be referred to as an "external bus", or a "system bus".

Referring specifically to FIG. 2, the processor port 4 is connected to a memory array 8, which in this embodiment is 512 bits square and 4 bits wide. The memory array 8 is connected to an on-chip shift register 9 which is capable of shifting serial data 512 bits long ×4 bits wide via the stable memory port 5.

In operation, host processor accesses are carried out via the host processor bus 6 and whenever desired, say, at regular intervals, stable memory control signals are transmitted on the processor bus 6 interleaved with the normal random accesses and these initiate stable memory operations on the stable memory busses 7. Subsequently, the stable memory operations are carried out without the need for transmission of any information on the processor bus 6. These operations may include copying of contents of the bank 2(a) to the bank 2(b). In one example, a page in the memory bank 2(a) is coupled with a page in the bank 2(b) to form a single stable page. Host processor accesses are then allowed only into the page in the bank 2(a) and the corresponding page in the bank 2(b) is inaccessible to the host processor. During stable memory operations, flags may be used to correctly indicate the validity of the copy and to protect against other accesses to these pages. Because stable memory ports 5 of each VRAM 3 are connected directly to equivalent or associated VRAMs 3 in the other memory bank, there is a very wide serial data path yielding a very high transfer rate. The transfer rate is particularly high because the shift register operations take relatively little time. In this embodiment, a 4 kbyte page may be copied in six micro seconds and compared in a further six micro secs.

It will be appreciated that because the circuit 1 is symmetrical either of the memory banks 2(a) and 2(b) may be used as the accessible bank or both may be used as a conventional memory depending on the instructions which are transmitted on the processor bus 6 from a control means, which may be the host processor. Indeed, the memory banks may be dynamically partitioned into stable memory and conventional memory portions depending on instructions received. This is an important aspect of the invention, particularly where from time to time stable memory operations are not as important as the storage of as much information as possible.

In cases where such alternatives are not required, it is envisaged that the processor bus may be connected to only one memory bank, the other bank permanently forming the inaccessible memory bank of the stable memory.

Figure 3:
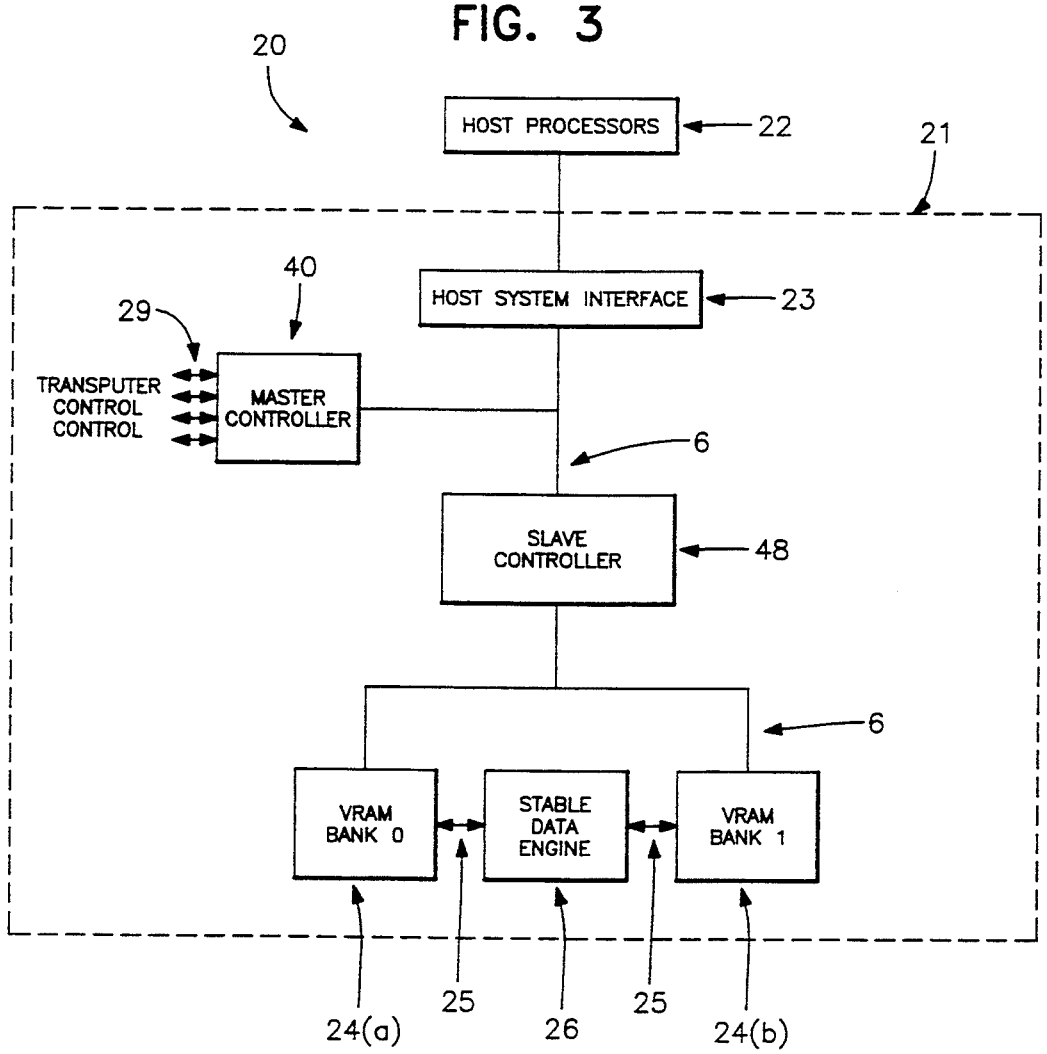
FIG. 3 is a schematic representation of portion of a computer incorporating a stable memory circuit of the invention.
Figure 4:
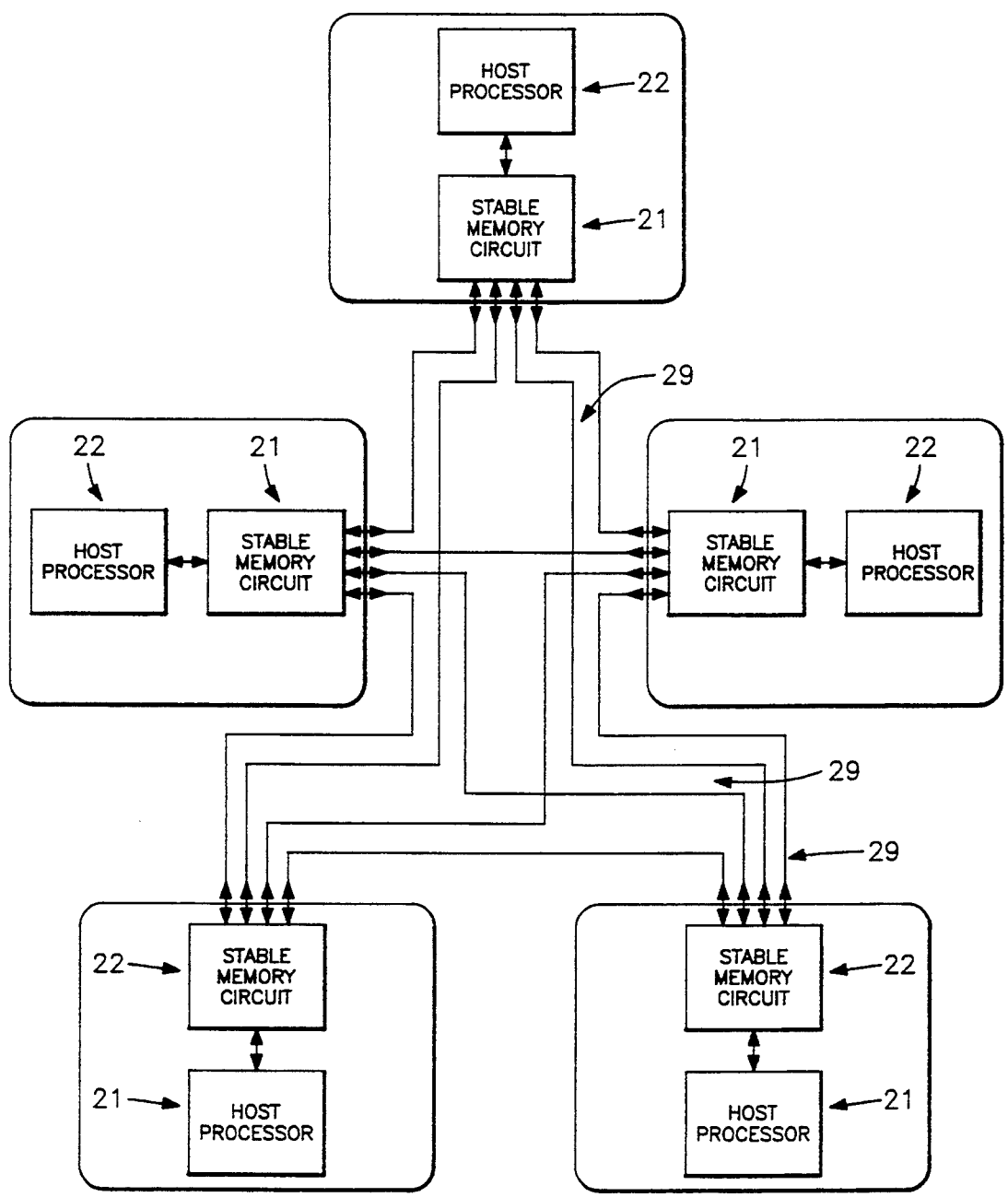
FIG. 4 is a diagram showing five computers interconnected via links.

Referring now to FIGS. 3 and 4, there is illustrated a portion of a computer 20 which incorporates a stable memory circuit 21 of the invention. Like parts are assigned the same reference numerals. The computer 20 comprises a host processor 22 connected to a host system interface 23. The stable memory circuit 21 comprises two memory banks 24(a) and 24(b), each comprising a plurality of VRAMs 3 which, for clarity, are not illustrated. Stable memory ports of the VRAMs 3 are connected to a stable memory bus 25 which connects each memory bank 24(a) and 24(b) to a stable data engine 26. The circuit 21 further comprises a dedicated stable memory control means, namely, a master controller 40 and a slave controller 48. The master controller 40 and the host system interface 23 are connected via the processor bus 6 to the slave controller 48, which is in turn connected to the memory banks 24(a) and 24(b), also via the processor bus 6. The master controller 40 is connected via links 29 to other computers. The stable data engine 26 is constructed from logic circuits and the slave controller 28 is constructed from logic circuits or a variant of presently available graphics processors.

In operation, the master controller 40 carries out high-level functions and fault handling. Invocation of stable memory operations is carried out by queuing calls in a memory bank. The master controller 40 passes lower-level duties to the slave controller 28, which manages each of the two memory banks 24(a) and 24(b), and the stable data engine 26.

Referring specifically to FIG. 4, the links 29 allow the master controller 40 and the slave controller 48 to be remotely booted, and the booting instructions may be stored in a memory bank 24(a) or 24(b). The links 29 also allow the master controller 40 carry out fault recovery operations in isolation from the host processor 22. This is important in the event that the host processor 22 is faulty.

The stable memory operations carried out by the stable data engine 26 may include copying, comparing, and searches including maximum/minimum, equal/not-equal, or inside-limits/outside-limits type searches. For the stable data engine 26 to perform a function, the master controller 40 must co-ordinate the following sequence:

1. tell the slave controller 48 to transfer from address A of the memory bank 24(a).
2. tell the slave controller 48 to transfer to address B of the memory bank 24(b).
3. tell the stable data engine 48 to process the data.
4. wait for completion.
5. read results from the stable data engine 26.

Serial transfers may be carried out in random fashion starting from any desired bit in the shift register and for any desired number of bits. Thus, there is complete flexibility in the manner in which stable memory operations are carried out.

To give an example of the speed with which data is transferred between the memory banks 24(a) and 24(b), if each bank is constructed from sixty-four, 256 k ×4 VRAMs, there can be a 256 bit wide ×40 Mbit/sec data path between the VRAMs and the stable data engine, which is capable of transferring 1280 Mbytes/sec. The stable memory port may be bussed between stable memory boards, so in this embodiment the serial data paths are reduced to 32 bits wide to reduce the influence of connector pin failures, resulting in a 32 bit ×40Mbit/sec inter-board data path capable of transferring 160 Mbytes/sec.

There are a number of ways of performing stable memory operations. For example, with atomic stable memory copying, the following sequence of operations may be performed by the stable data engine 26:

1. Copy N bytes from bank 24(a) address A to bank 24(b) address B.
2. Compare N bytes from bank 24(a) address A with N bytes from bank 24(b) address B.

This is perhaps the simplest sequence. More comprehensive atomic stable memory operations typically involve more copying. In all cases flags must be released and set in the correct order to nominate the currently valid copy.

It will be appreciated that operation of the stable data engine 26 is concurrent with operation of the host processor 22, and it provides for a much greater data handling capacity for a computer system. It will also be appreciated that the stable data engine may fall within a wide range of complexity, depending on the stable memory operations to be supported. Further, the stable data engine need not intercept the stable memory ports as shown in FIG. 3, but may instead simply monitor the stable memory ports, which will then be directly connected between the memory banks as shown in FIG. 1 and will typically allow faster data transfer.

Figure 5:
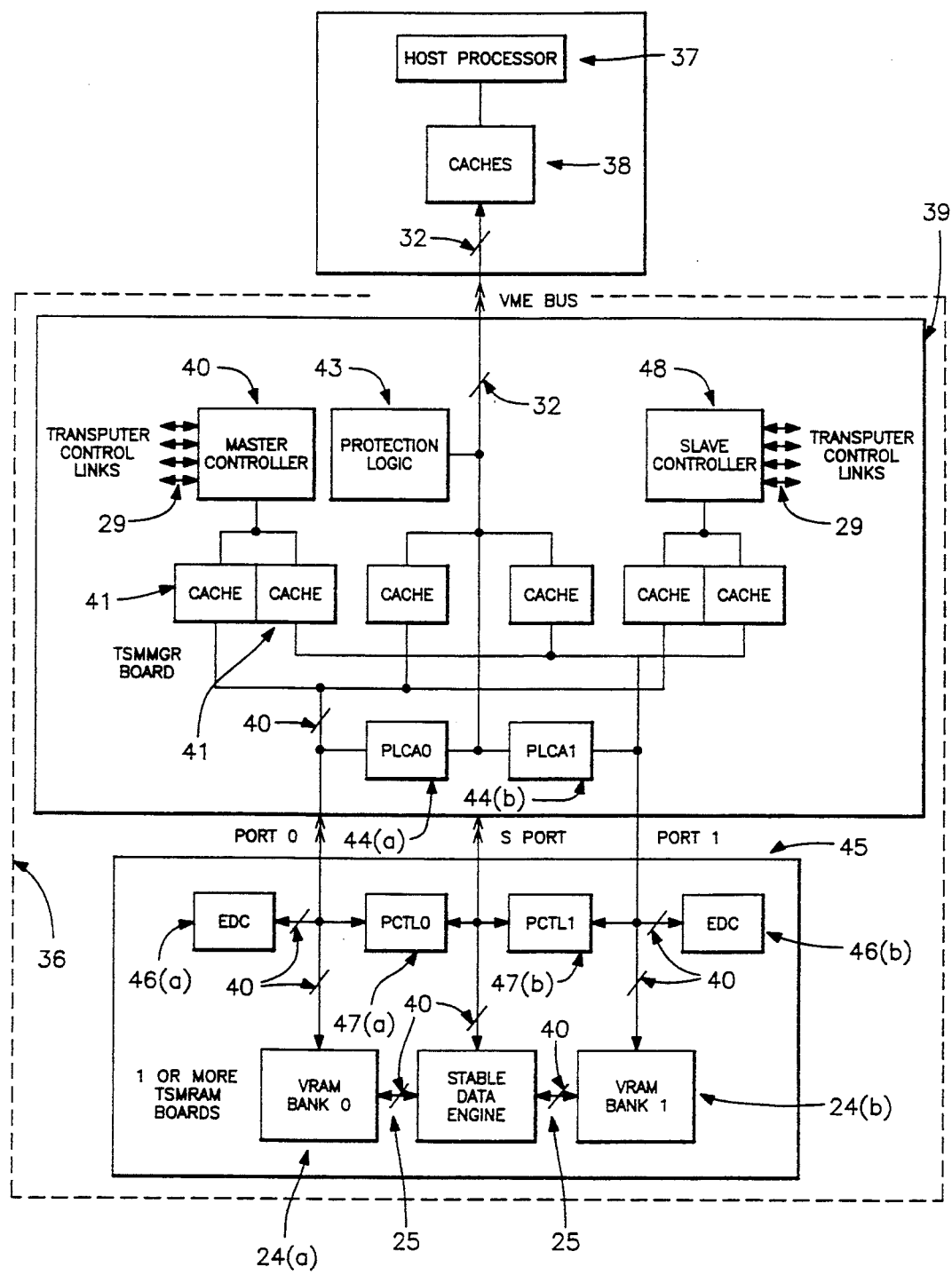
FIG. 5 is a schematic representation of a computer incorporating an alternative construction of stable memory circuit.

Referring now to FIG. 5, there is illustrated portion of a an alternative computer, indicated generally by the reference numeral 35 incorporating a stable memory circuit 36, host processors 37 and host caches 38. Again, like parts are assigned the same reference numerals. The stable memory circuit 36 comprises a control circuit 39 and a memory circuit 45. The control circuit 39 comprises a master controller 40 and a slave circuit 48, each connected to cache circuits 41. The cache circuits 41 are also connected directly to the processor bus 6. A protection logic circuit 43 and a pair of port logic circuit arrays (PLCAs) 44(a) and 44(b) are connected to the processor bus 6. The memory circuit 45 includes a pair of error detection and correction circuits (EDC circuits) 46(a) and 46(b), and a pair of port controllers (PCTLs) 47(a) and 47(b) connected to the cache circuits 41.

The stable memory circuit 36 essentially carries out the same functions as the stable memory circuits previously described. The additional circuits are used to improve performance. For example, the EDC circuits 46(a) and 46(b) perform both error detection and consequent correction of data. The PCTLs 47(a) and 47(b) handle error logging of the address, syndrome, parity, and the double-bit error flag as well as VRAM control. The PCLAs 44(a) and 44(b) also carry out error detection and control of ports 0 and port 1, and in general additional circuits in the stable memory circuit 36 cater for hardware errors and for continuing satisfactory operation in the event of failure of a single component. In this embodiment, both the master and slave controllers 40 and 48 are transputers and the distinction between them is more apparent than real, since after initialization the two share the same workload as evenly as possible. It is envisaged that in general there would be more than one of the memory circuits 45 and each would be on a separate circuit board. Each memory assembly 45 would be battery-backed, as would memory circuits of all of the above embodiments.

We claim:

1. A stable memory circuit comprising:
   at least two physically separate and independent memory banks, each bank comprising a set of solid state memory devices, the memory devices being constructed from mutually physically separate pieces of semiconductor material so as to be physically separate;
   a stable memory bus connected directly between the memory banks, the stable memory bus comprising a set of parallel electrical conductors;
   a host processor interface;
   a processor bus comprising a set of parallel electrical conductors connected between the memory banks and the host processor interface;
   a normal power supply means for providing a power supply to all of the memory devices via electrical conductors of the stable memory circuit under normal operating conditions;
   a standby power supply means for providing a standby power supply to all of the memory devices via electrical conductors of the stable memory circuit in the event of a fault in the normal power supply means;
   a plurality of dual-ported video random access memory devices in each of said at least two memory banks, each video random access memory device comprising an external processor data port and a physically separate external stable memory port, each external processor port being connected to a conductor of the processor bus and each external stable memory port being connected to a conductor of the stable memory bus; and
   a transfer means connected to the stable memory bus and comprising means for directing stable memory data transfer between external stable memory ports of the video random access memory devices in different memory banks concurrently with random accesses of a host processor to the memory devices via the external processor ports and the processor bus.

2. A stable memory circuit as claimed in claim 1, wherein the stable memory circuit further comprises a controller connected to at least one video random access memory device at its external processor data port in each memory bank and comprising means for transmitting control signals to partition each bank into stable and non-stable sections.

3. A stable memory circuit as claimed in claim 2, wherein the controller has a remote computer interface.

4. A stable memory circuit as claimed in claim 1, wherein the transfer means includes a stable data engine connected to the external stable memory ports of memory devices in different memory banks for carrying out stable memory processing operations on stable memory data handled by the external stable memory ports.

5. A stable memory circuit as claimed in claim 1, wherein each external stable memory port comprises a shift register for high-speed data transfer.

* * * * *